United States Patent
Hamner (10) Patent No.: US 7,534,133 B2
(45) Date of Patent: May 19, 2009

(54) ELECTRICAL CONNECTOR ASSEMBLY WITH ALIGNMENT PIN

(75) Inventor: Richard Elof Hamner, Hummelstown, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/714,531

(22) Filed: Mar. 5, 2007

(65) Prior Publication Data
US 2008/0220629 A1  Sep. 11, 2008

(51) Int. Cl.
*H05K 1/00* (2006.01)
(52) U.S. Cl. ......................... 439/526; 439/66
(58) Field of Classification Search ............... 439/71, 439/66, 74, 526
See application file for complete search history.

(56) References Cited

U.S. PATENT DOCUMENTS

| | | | |
|---|---|---|---|
| 4,927,369 A | 5/1990 | Grabbe et al. | |
| 5,622,514 A | 4/1997 | Crompton, III et al. | |
| 5,730,620 A * | 3/1998 | Chan et al. | 439/526 |
| 5,919,050 A * | 7/1999 | Kehley et al. | 439/71 |
| 6,354,844 B1 | 3/2002 | Coico et al. | |
| 6,724,095 B2 | 4/2004 | D'Amato et al. | |
| 6,786,738 B2 | 9/2004 | Lin | |
| 6,881,073 B2 | 4/2005 | Bali et al. | |
| 7,059,869 B2 | 6/2006 | Wertz et al. | |
| 2005/0174744 A1* | 8/2005 | Zheng | 361/760 |
| 2005/0191873 A1* | 9/2005 | Wertz et al. | 439/68 |

* cited by examiner

*Primary Examiner*—Briggitte R Hammond
*Assistant Examiner*—Vanessa Girardi (57) ABSTRACT

An electrical connector for connection to an electrical component assembly along a connection axis is provided. The electrical connector includes a body holding a first array of electrical contacts. The first array of electrical contacts are configured to electrically connect to a second array of electrical contacts of the electrical component assembly. An alignment pin extends outwardly from the body. The alignment pin is configured to be received within an alignment opening of the electrical component assembly for aligning the electrical component assembly with the body. The alignment pin includes at least one slot configured to receive an edge portion of the electrical component assembly that at least partially defines the alignment opening thereof.

20 Claims, 7 Drawing Sheets

ELECTRICAL CONNECTOR ASSEMBLY WITH ALIGNMENT PIN

BACKGROUND OF THE INVENTION

The invention relates generally to electrical connectors, and more particularly, to electrical connector assemblies having alignment pins for aligning an electrical component of the assembly with an electrical connector of the assembly.

Some electrical connectors include an array of electrical contacts arranged on a mating face of the connector that engage a corresponding array of electrical contacts on an electrical component. Because of the relatively large number of electrical contacts associated with some contemporary connectors and components, frictional and deflectional resistance to engagement and disengagement of the electrical contacts can be relatively large, which may make it difficult for a person to connect and disconnect the electrical connector and component. To facilitate easier connection and disconnection of electrical connectors and components, zero insertion force (ZIF) and low insertion force (LIF) connectors have been developed. Some ZIF and LIF connectors include a base that holds the array of electrical contacts and a cover that includes a corresponding array of openings. The cover is slidable relative to the base such that when the cover is an open position relative to the base, the electrical contacts of the electrical component are insertable through the openings in the cover without engaging the electrical contacts of the base, and therefore without encountering insertion resistance. When the cover is moved relative to the base into a closed position, the electrical contacts of the electrical component are translated into engagement with the electrical contacts held within the base of the electrical connector. Movement of the cover back to the open position retracts the electrical contacts of the electrical component from engagement with the electrical contacts held by the base to thereby release the electrical component for removal from the connector.

However, some known ZIF and LIF connectors do not prevent movement of the cover relative to the base before the electrical component is properly positioned on the cover. Specifically, the cover can be moved to the closed position when the electrical contacts of the electrical component are only partially received within the openings. When the electrical contacts of the electrical component are only partially received within the openings, the electrical contacts of the electrical component and connector may be misaligned such that when the cover is moved to the closed position the electrical contacts may be damaged due to improper engagement thereof. Moreover, when the cover is moved to the closed position before the electrical component is properly positioned on the cover, a user may still have to overcome a relatively large resistance to complete the engagement between the electrical connector and component. Furthermore, the cover adds an additional component to known ZIF and LIF connectors.

What is needed, therefore, is an electrical connector assembly that prevents electrical contacts of a component from engaging electrical contacts of the connector unless the component is properly positioned on the connector.

BRIEF DESCRIPTION OF THE INVENTION

In one embodiment, an electrical connector for connection to an electrical component assembly along a connection axis is provided. The electrical connector includes a body holding a first array of electrical contacts. The first array of electrical contacts are configured to electrically connect to a second array of electrical contacts of the electrical component assembly. An alignment pin extends outwardly from the body. The alignment pin is configured to be received within an alignment opening of the electrical component assembly for aligning the electrical component assembly with the body. The alignment pin includes at least one slot configured to receive an edge portion of the electrical component assembly that at least partially defines the alignment opening thereof.

In another embodiment, an electrical connector assembly is provided. The electrical connector assembly includes an electrical component sub-assembly including a first array of electrical contacts and an alignment opening, and an electrical connector configured for connection to the electrical component sub-assembly along a connection axis. The electrical connector includes a body holding a second array of electrical contacts that is configured to electrically connect to the first array of electrical contacts. An alignment pin extends outwardly from the body. The alignment pin is configured to be received within the alignment opening of the electrical component sub-assembly for aligning the electrical component assembly with the electrical connector. The alignment pin includes at least one slot configured to receive an edge portion of the electrical component sub-assembly that at least partially defines the alignment opening of the electrical component sub-assembly.

In another embodiment, an electrical component assembly for connection to an electrical connector along a connection axis is provided. The electrical component assembly includes a body holding a first array of electrical contacts. The first array of electrical contacts are configured to electrically connect to a second array of electrical contacts of the electrical connector. An alignment pin extends outwardly from the body. The alignment pin is configured to be received within an alignment opening of the electrical connector for aligning the electrical connector with the body. The alignment pin includes at least one slot configured to receive an edge portion of the electrical connector that at least partially defines the alignment opening thereof.

DETAILED DESCRIPTION OF THE INVENTION

Figure 1:
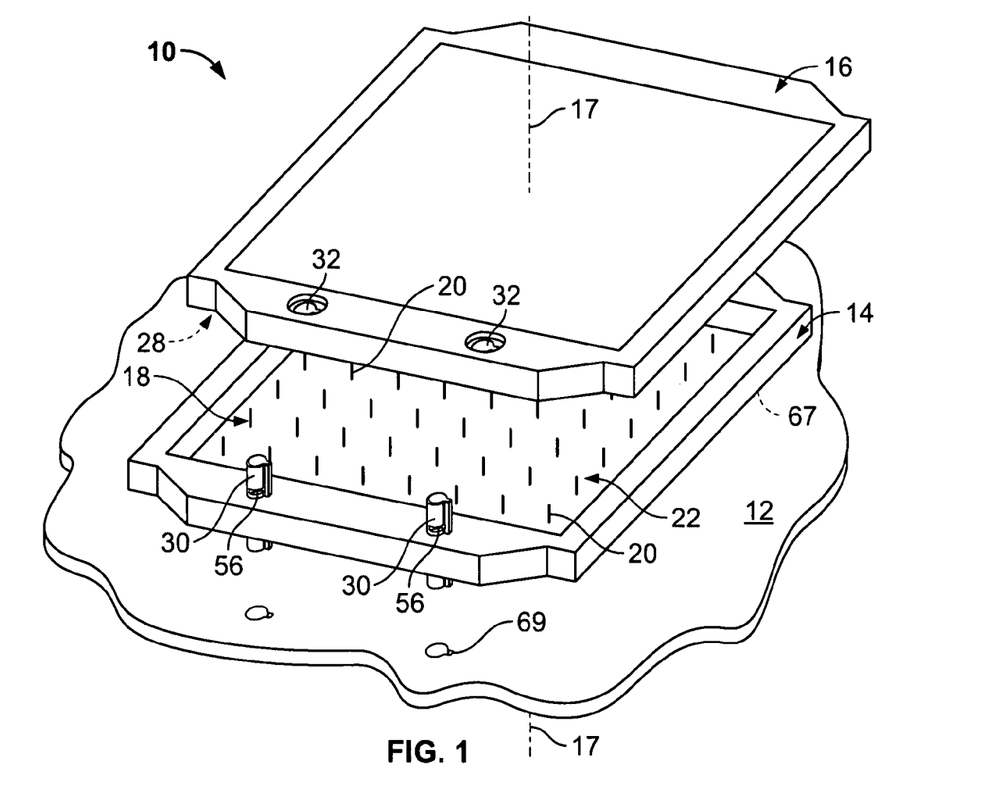
FIG. 1 is a partially exploded perspective view of an electrical connector assembly formed in accordance with an embodiment of the present invention.

FIG. 1 is a partially exploded perspective view of an electrical connector assembly 10 formed in accordance with an embodiment of the present invention. The assembly 10, which is mounted on a substrate 12, includes an electrical connector 14 and an electrical component assembly 16. The electrical component assembly 16 is installed in a preliminary position on the electrical connector 14 by movement along a connection axis 17. The electrical connector 14 includes an array 18 of a plurality of electrical contacts 20 on a mating side 22 thereof. Similarly, the electrical component assembly 16 includes an array 24 (FIGS. 2 and 3) of a plurality of electrical contacts 26 (FIG. 3) on a mating side 28 thereof. When the electrical component assembly 16 is connected to the electrical connector 14, the arrays 18, 24 are electrically connected such that the array 24 of the electrical component assembly 16 is electrically connected to electrical contacts and/or pathways (not shown) on the substrate 12 that are electrically connected to the array 18. The electrical connector 14 may include an alignment pin 30 that is received within an alignment opening 32 of the electrical component assembly 16 for aligning the electrical component assembly 16 with the electrical connector 14, as will be described below in more detail.

The substrate 12 may be any suitable structure and/or device to which it is desired to mount the electrical component thereon, such as, but not limited to, a printed circuit board. Alternatively, the electrical connector 14 is not mounted on a substrate, but rather is an electrical wire and/or cable connector that electrically connects the electrical component assembly 16 to an electrical cable (not shown) and/or a plurality of electrically conductive wires (not shown).

Figure 2:
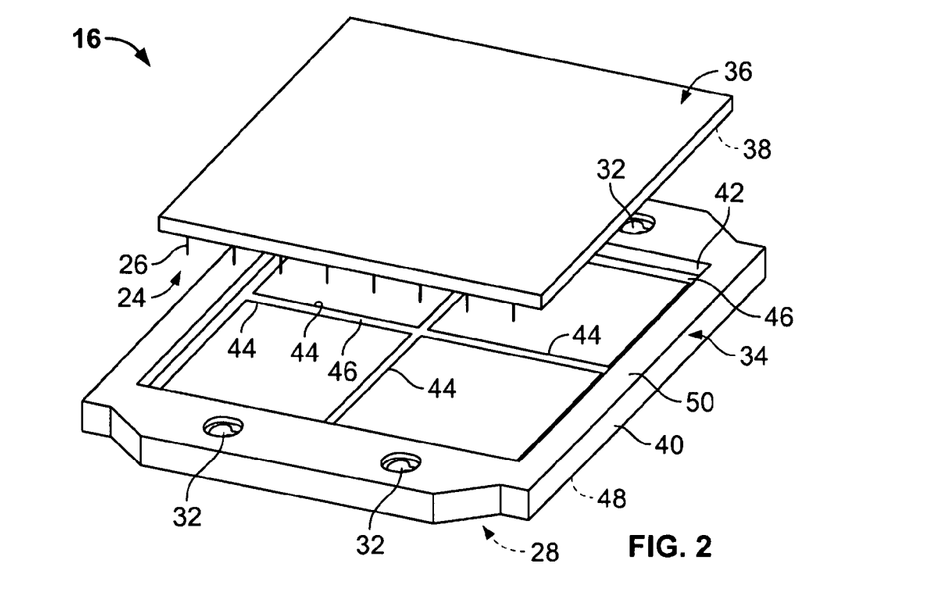
FIG. 2 is an exploded perspective view of an electrical component assembly shown in FIG. 1 formed in accordance with an embodiment of the present invention.

FIG. 2 is an exploded perspective view of the electrical component assembly 16 formed in accordance with an embodiment of the present invention. In the exemplary embodiment, the electrical component assembly 16 includes a base 34 that holds an electrical component 36. The electrical contacts 26 of the array 24 are held by the electrical component 36 such that a portion of each of the electrical contacts 26 extends outwardly from an engagement surface 38 (more clearly shown in FIG. 3) of the electrical component 36. The base 34 includes a body 40 having a recess 42 for receiving the electrical component 36 therein and a plurality of openings 44 extending through the body 40 proximate the recess 42 for receiving the array 24 of the electrical contacts 26. The base 34 also includes a pair of opposite engagement surfaces 46, 48 for engaging the electrical component 36 and the electrical connector 14 (FIG. 1), respectively.

Figure 3:
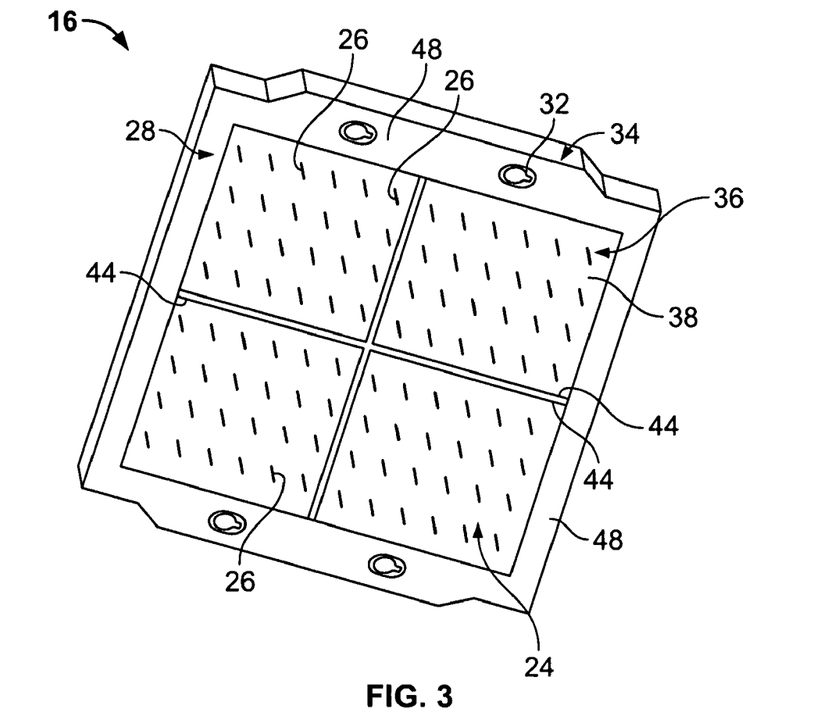
FIG. 3 is another perspective view of the electrical component assembly shown in FIG. 2.

FIG. 3 is another perspective view of the electrical component assembly 16. When the electrical component 36 is received within the recess 42 (FIG. 2), the engagement surface 38 of the electrical component 36 is engaged with the engagement surface 46 (FIG. 2) of the base 34, and the electrical contacts 26 of the array 24 extend through the openings 44 such that the contacts 26 extend along the mating side 28 of the assembly 16. The mating side 28 of the assembly includes the engagement surface 48 that engages the electrical connector 14 (FIG. 1) when the assembly 16 and the connector 14 are connected as described below.

The base 34 may include a plurality of the alignment openings 32. Additionally or alternatively, the electrical component 36 may include one or more of the alignment openings 32. Although four alignment openings 32 are shown, the electrical component assembly 16 may include any number of alignment openings 32 for receiving any number of alignment pins 30 (FIG. 1) of the electrical connector 14. Moreover, although four openings 44 are shown for each receiving a plurality of the electrical contacts 26, the base may include any number of openings 44 each receiving any number of electrical contacts 26 therein. For example, the base 34 may alternatively include a number of openings 44 that corresponds to the number of electrical contacts 26 such that each opening 44 receives only one contact 26 therein. The electrical component assembly 16 may alternatively not include the base 34. As used herein, the term "electrical component assembly" is intended to include embodiments where the base 34 is not included, including embodiments where the assembly 16 only includes the electrical component 36 (including the associated electrical contact array 24).

The electrical component 36 may be any suitable type of electrical component, such as, but not limited to, a processor, a printed circuit board, an integrated circuit, an electrical module, and/or another electrical device. Although described and illustrated herein as being received within the recess 42, the electrical component 36 may be mounted on the base 34 in any suitable configuration and/or arrangement, and/or using any suitable structure and/or means. For example, the electrical component may alternatively mount directly to an upper surface 50 (FIG. 2) of the base 34, whether or not the base 34 includes the recess 42. Moreover, the electrical component 36 may be retained on base 34 using any suitable structure and/or means, such as, but not limited to, an adhesive, solder, and/or a press fit relationship with a portion of the base 34.

In the exemplary embodiment, the array 24 of the electrical contacts 26 electrically connects directly to the array 18 (FIG. 1) of the electrical connector 14 when the connector 14 and the assembly 16 are connected. Specifically, when the electrical connector 14 and the electrical component assembly 16 are connected as described below, a portion of each electrical contact 26 of the array 24 directly engages a corresponding electrical contact 20 of the array 18 on the electrical connector 14. Alternatively, the arrays 18, 24 do not directly engage each other, but rather the base 34 includes an intermediate array of electrical contacts (not shown) that engages both of the arrays 18, 24 to indirectly electrically connect the arrays 18, 24 together.

The array 24, as well as any intermediate arrays if included, may have any suitable configuration, arrangement, and/or pattern of the electrical contacts 26 that enables operative electrical connection between the electrical component 36 and the electrical connector 14. The configuration, arrangement, and/or pattern of the array 24 of the electrical component 36 may substantially match the configuration, arrangement, and/or pattern of the array 18 of the electrical connector 14, whether an intermediate array is included. Although illustrated as pin contacts, the electrical contacts 26 may each be any suitable type of electrical contact that enables operative electrical connection between the electrical component 36 and the electrical connector 14, such as, but not limited to, ball contacts (e.g., solder balls), electrically conductive pads, and/ or electrically conductive traces. Electrical contacts of any included intermediate arrays may likewise be any suitable type of electrical contact.

Figure 4:
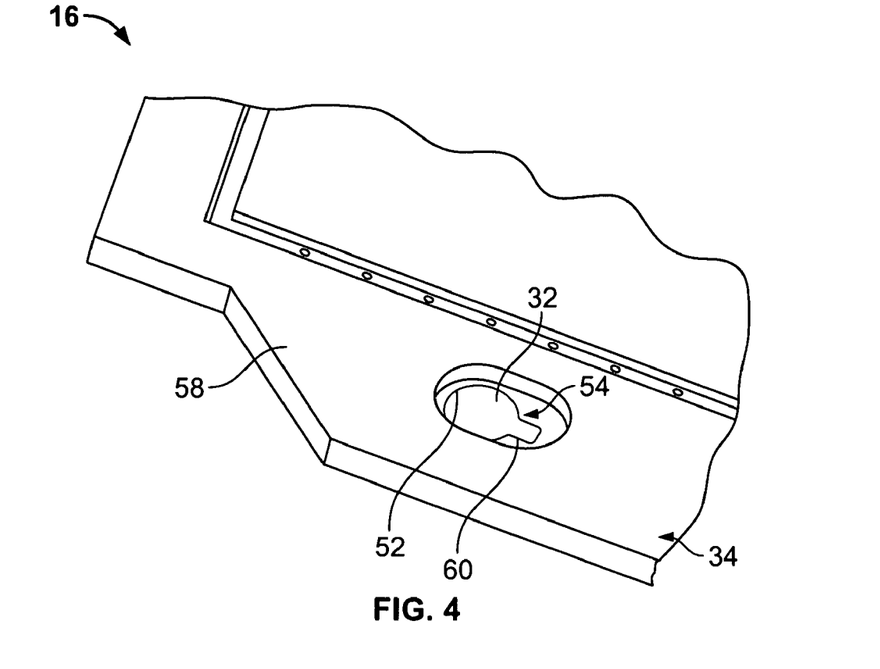
FIG. 4 is a perspective view of a portion of the electrical component assembly shown in FIGS. 2 and 3 illustrating an alignment opening formed in accordance with an embodiment of the present invention.

FIG. 4 is a perspective view of a portion of the electrical component assembly 16 illustrating an alignment opening 32 formed in accordance with an embodiment of the present invention. Each alignment opening 32 receives a corresponding alignment pin 30 (FIG. 1) of the electrical connector 14 therein. The alignment opening 32 is defined by an edge 52 of the base 34. An edge portion 54 of the base 34 that includes a portion of the edge 52 and portions of the base 34 adjacent the edge 52 is receivable within a pair of slots 56 (FIG. 7) within the corresponding alignment pin 30 when connecting the electrical component assembly 16 and the electrical connector 14, as will be described in more detail below. Although the edge 52 that defines the alignment opening 32 and the portions of the base 34 adjacent the edge 52 are shown as recessed from a surface 58 of the base 34 opposite the engagement surface 48 (FIGS. 2 and 3), the edge 52 and adjacent base portions may alternatively not be recessed from the surface 58 such that the edge portion 54 that is received within the corresponding slot 56 has generally the same thickness as the surrounding portions of the base 34.

The alignment opening 32 may optionally include a keying component 60 that cooperates with a keying component 62 (FIG. 7) of the corresponding alignment pin 30 to facilitate reception of the alignment pin 30 within the alignment opening 32 generally in only one relative orientation.

Figure 5:
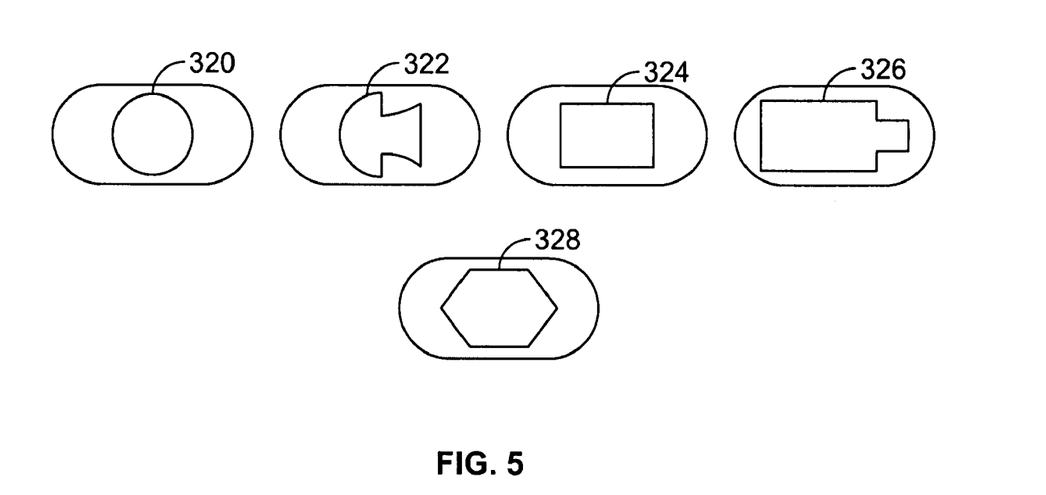
FIG. 5 illustrates plan views of a plurality of exemplary alternative shapes of alignment openings formed in accordance with embodiments of the present invention.

Each edge portion 54 may have any suitable size and/or shape that enables the edge portion 54 to be received within the slot 56 of the corresponding alignment pin 30. Likewise, each alignment opening 32 may have any suitable size and/or shape that enables the alignment opening 32 to receive the corresponding alignment pin 30 therein. Moreover, each optional keying component 60 may have any suitable size and/or shape that enables the keying component 60 to cooperate with the keying component 62 of the corresponding alignment pin 30. In the exemplary embodiment, each alignment opening 32 is shown as partially circular, with the keying component 60 extending outwardly from a circumference of the circle. Examples of other suitable shapes of portions or all of the alignment openings 32 include, but are not limited to, square, rectangular, oval-shaped, and/or hexagonal. FIG. 5 illustrates plan views of a plurality of other exemplary shapes of alignment openings 320, 322, 324, 326, 328 formed in accordance with embodiments of the present invention.

Figure 6:
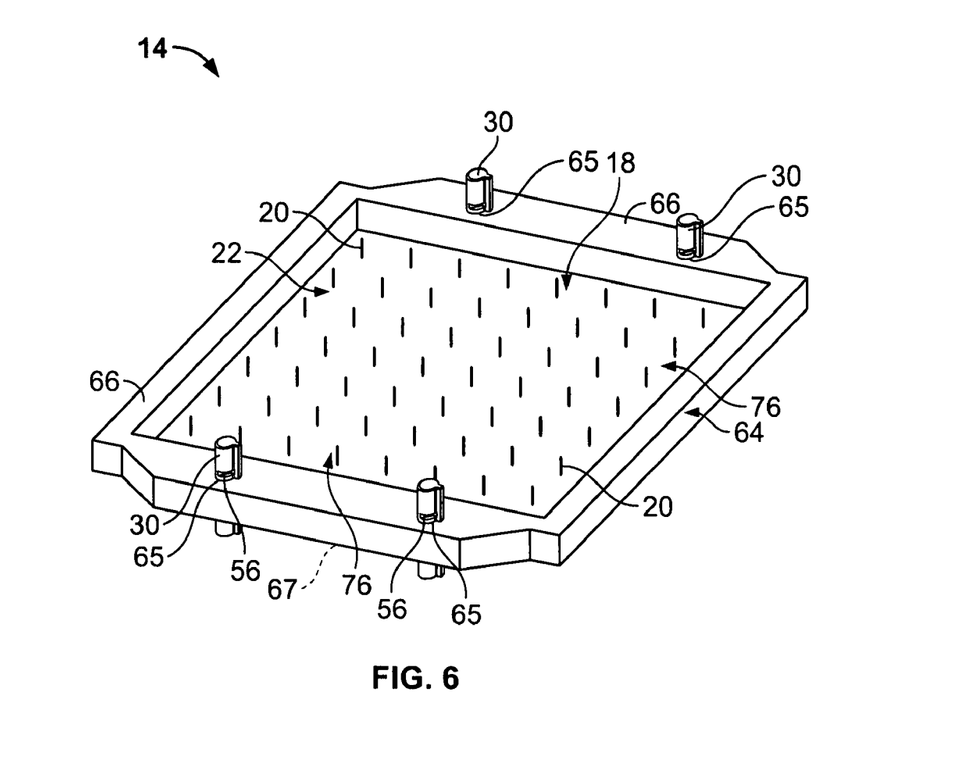
FIG. 6 is a perspective view of an electrical connector shown in FIG. 1 formed in accordance with an embodiment of the present invention.

FIG. 6 is perspective view of the electrical connector 14 formed in accordance with an embodiment of the present invention. The electrical connector 14 includes a body 64 that holds the electrical contacts 20 of the array 18. The electrical contacts 20 of the array 18 are held by the body 64 such that a portion of each of the electrical contacts 20 extends outwardly along the mating side 22 of the electrical connector 14. As discussed above, the electrical contacts 20 of the array 18 are electrically connected to electrical contacts and/or pathways (not shown) on the substrate 12 (FIG. 1). The mating side 22 of the body 64 includes an engagement surface 66 that engages the engagement surface 48 (FIG. 3) of the electrical component assembly 16 when the connector 14 and the assembly 16 are connected, as will be described in more detail below.

The body 64 of the electrical connector 14 may include a plurality of the alignment pins 30 extending outwardly from the body 64 along the mating side 22 thereof. Although four alignment pins 30 are shown, the electrical connector 14 may include any number of alignment pins 30 for insertion into any number of alignment openings 32 (FIGS. 1-4) of the electrical component assembly 16. Each alignment pin 30 may be mounted on the body 64 in any suitable configuration and/or arrangement, and/or using any suitable structure and/or means that enable the pins 30 to function as described herein. For example, a portion of an alignment pin 30 may be received within an opening 65 of the body 64, as is shown in the exemplary embodiment of FIG. 6. Another example includes mounting a portion of an alignment pin 30 directly to the engagement surface 66. The alignment pins 30 may be retained on the body 64 using any suitable structure and/or means that enable the pins 30 to function as described herein, such as, but not limited to, an adhesive and/or a press fit relationship with a portion of the body 64 (e.g., an opening 65 in which a portion of the pin 30 is received). In the exemplary embodiment, the alignment pins 30 each extend outwardly not only from the engagement surface 66, but also from an engagement surface 67 that engages the substrate 12 (FIG. 1). Accordingly, in the exemplary embodiment, the alignment pins 30 may facilitate aligning the electrical connector 14 with the substrate 12 by each being received within a corresponding opening 69 (FIG. 1) within the substrate. Alternatively, one, some, or all of the alignment pins 30 do not extend outwardly from the engagement surface 67.

The array 18 may have any suitable configuration, arrangement, and/or pattern of the electrical contacts 20 that enables operative electrical connection between the electrical component 36 and the electrical connector 14. The configuration, arrangement, and/or pattern of the array 18 of the electrical connector 14 may substantially match the configuration, arrangement, and/or pattern of the array 24 of the electrical component assembly 16, whether an intermediate array is included. Although illustrated as pin contacts, the electrical contacts 20 may each be any suitable type of electrical contact that enables operative electrical connection between the electrical component 36 and the electrical connector 14, such as, but not limited to, ball contacts (e.g., solder balls), electrically conductive pads, and/or electrically conductive traces.

Figure 7:
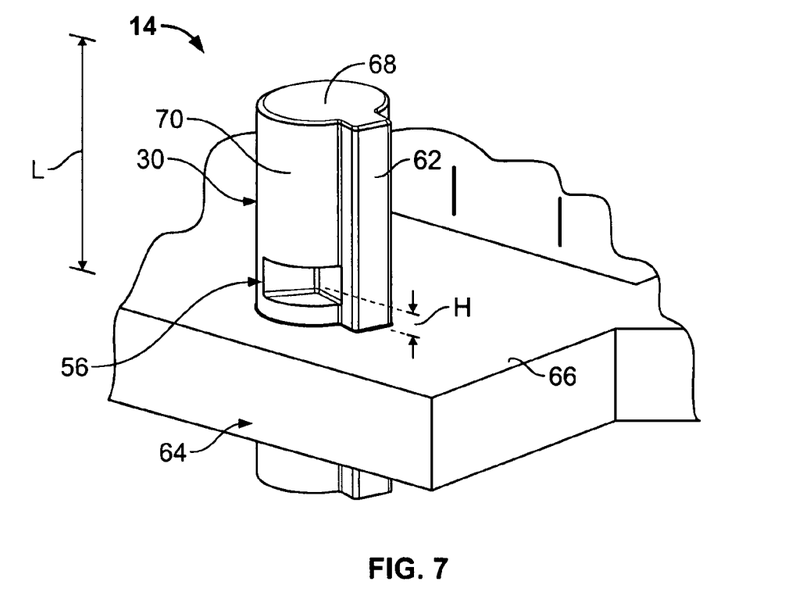
FIG. 7 is a perspective view of a portion of the electrical connector assembly shown in FIG. 6 illustrating an alignment pin formed in accordance with an embodiment of the present invention.

FIG. 7 is a perspective view of a portion of the electrical connector 14 illustrating the alignment pin 30 formed in accordance with an embodiment of the present invention. Each alignment pin 30 is receivable within a corresponding alignment opening 32 (FIGS. 1-4) of the electrical component assembly 16 (FIGS. 1-4). Each alignment pin 30 extends outward from the body 64 along a length L measured between the engagement surface 66 of the body 64 and an end 68 of the pin 30. The alignment pin 30 includes a body 70 having a pair of slots 56 therein. As discussed above, the slots 56 receive the corresponding edge portion 54 (FIG. 4) of the base 34 (FIGS. 1-4) of the electrical component assembly 16 when connecting the electrical component assembly 16 and the electrical connector 14. The slots 56 of each alignment pin 30 are positioned at a location along the length L of the alignment pin 30 such that when the edge portion 54 of the base 34 of the electrical component assembly 16 is received within the slots 56, the electrical component assembly 16 is at a predetermined position along the connection axis 17 (FIG. 1) relative to the body 64 of the electrical connector 14. Specifically, the location of the slots 56 along the length L of the alignment pin 30 is selected to be a predetermined height H, measured from a central portion of the slot 56, relative to the engagement surface 66 of the body 64 of the electrical connector 14. In some embodiments, the height H and/or the length L may be selected to provide further keying features of the alignment pins 30 and openings 32. Operation of the slots 56 to position the electrical component assembly 16 at the predetermined position along the connection axis 17 relative to the body 64 will be described in more detail below.

The alignment pin 30 may optionally include the keying component 62 that cooperates with the keying component 60 (FIG. 4) of the corresponding alignment opening 32 to facilitate reception of the alignment pin 30 within the alignment opening 32 generally in only one relative orientation.

Figure 8:
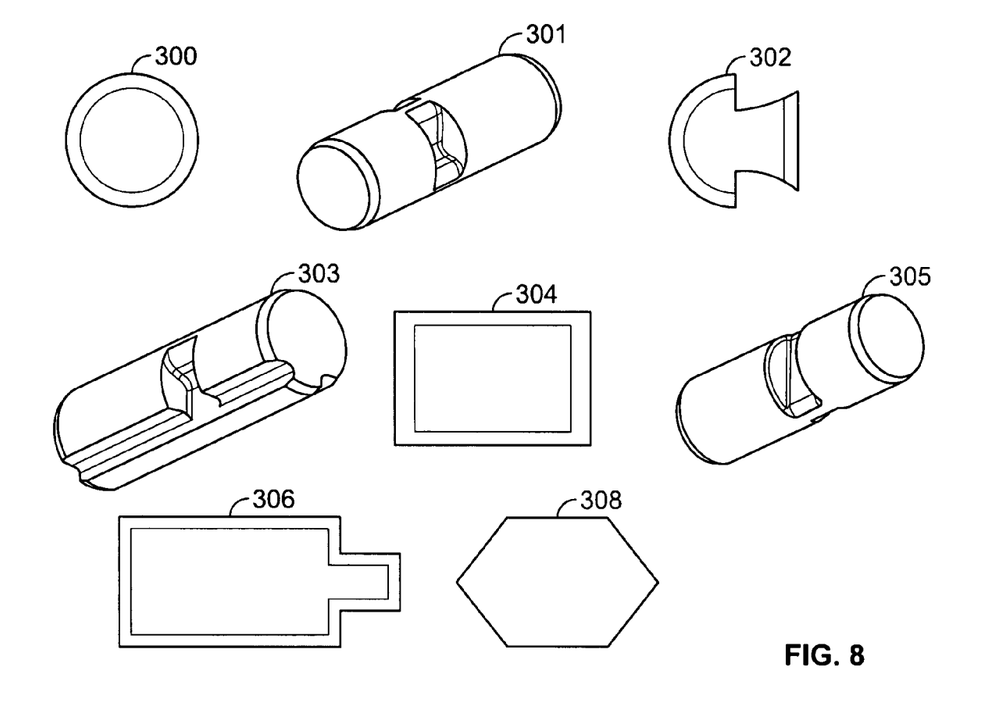
FIG. 8 illustrates views of a plurality of exemplary alternative shapes of alignment pins formed in accordance with embodiments of the present invention.

Each alignment pin 30 may have any suitable size and/or shape that enables the alignment pin 30 to be received within the corresponding alignment opening 32. Although shown as elongate, the body 70 of the alignment pin 30, and/or the length L of the alignment pin 30, may not be elongate. Each optional keying component 62 may have any suitable size and/or shape that enables the keying component 62 to cooperate with the keying component 60 of the corresponding alignment opening 32. In the exemplary embodiment, each alignment pin 30 is shown as having a partially circular cross section, with the keying component 62 extending outwardly from a circumference of the circle. Examples of other suitable shapes of portions or all of the alignment pins 30 include, but are not limited to, square, rectangular, oval-shaped, and/or hexagonal. FIG. 8 illustrates views of a plurality of other exemplary shapes of alignment pins 300, 301, 302, 303, 304, 305, 306, 308 formed in accordance with embodiments of the present invention.

Each slot 56 may have any suitable size and/or shape that enables the edge portion 54 of the corresponding alignment opening 32 to be received within the slot 56. Although each slot 56 may extend in any direction(s) relative to the length L of the corresponding alignment pin 30 that enables the slot to function as described herein, in the exemplary embodiment, each slot 56 extends across the corresponding alignment pin 30 generally transversely relative to the length L of the alignment pin 30. Although the alignment pins 30 are shown and described herein as having the pair of opposite slots 56, alternatively one or more of the alignment pins 30 may have a single slot that extends through the alignment pin body, such as, but not limited to, the slot 560 of the alignment pin 307 shown in FIG. 9.

Figures 9, 10:
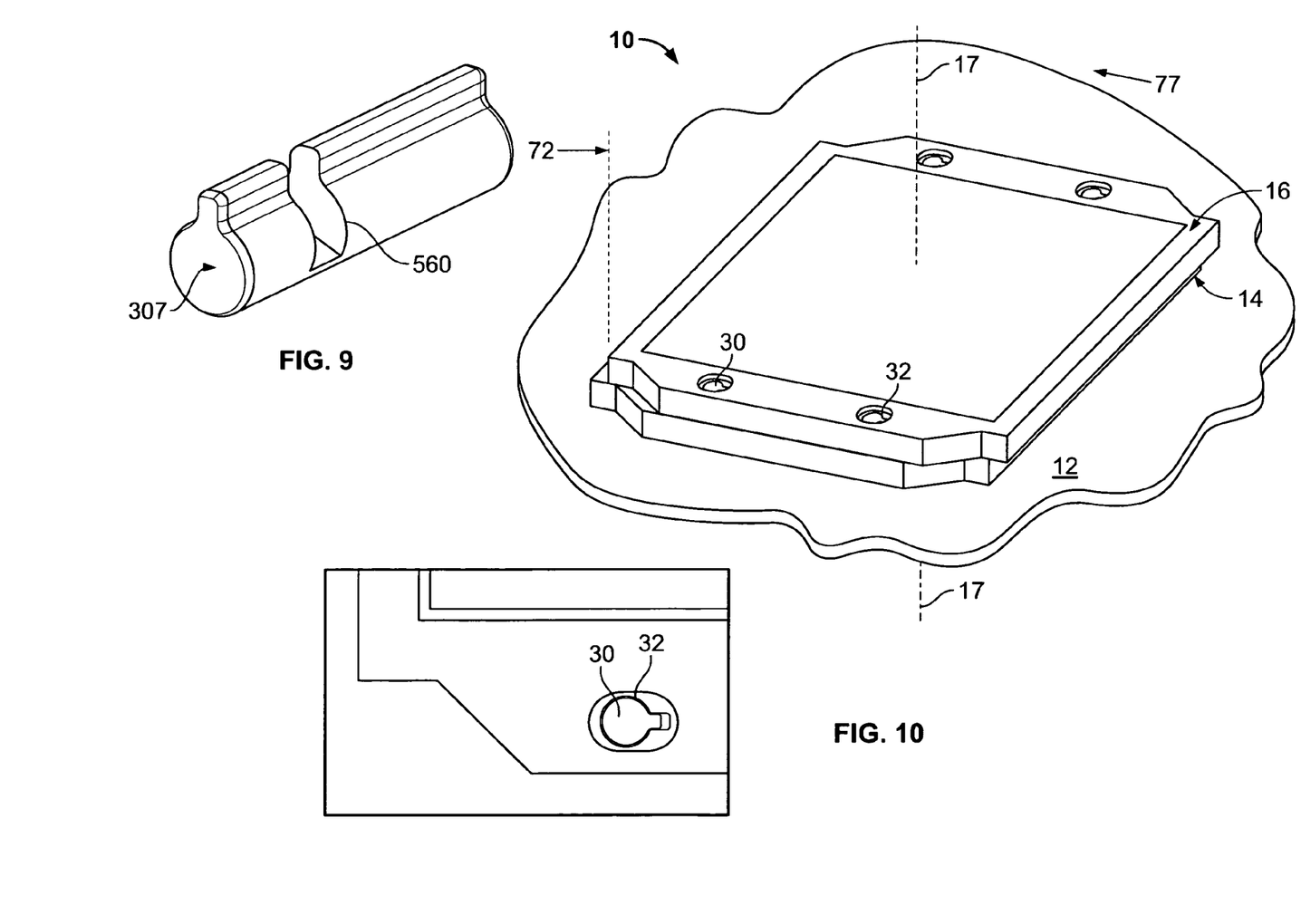
FIG. 9 is a perspective view of an exemplary alternative embodiment of an alignment pin formed in accordance with an embodiment of the present invention.
FIG. 10 is a perspective view of the electrical connector assembly shown in FIG. 1 in a position wherein electrical contacts of the assembly are not engaged.

In operation, and referring now to FIG. 10, to connect the electrical component assembly 16 to the electrical connector 14, the electrical component assembly 16 is moved along the connection axis 17 toward the electrical connector 14 until the engagement surface 48 (FIG. 3) of the electrical component assembly 16 is engaged with the engagement surface 66 (FIG. 6) of the electrical connector 14, shown in FIG. 10 and indicated as position 72. As the electrical component assembly 16 is moved along the axis 17 into the position 72, each alignment pin 30 of the electrical connector 14 is received within the corresponding alignment opening 32 of the electrical component assembly. When in the position 72, each electrical contact 26 (FIGS. 2 and 3) of the array 24 (FIGS. 2 and 3) of the electrical component assembly 16 extends within a corresponding gap 76 (FIG. 6) between adjacent electrical contacts 20 (FIGS. 1 and 6) of the array 18 (FIGS. 1 and 6) of the electrical connector 14 such that each electrical contact 26 is spaced from the corresponding electrical contact 20. When in the position 72, each alignment pin 30 is received within the corresponding alignment opening 32. However, each edge portion 54 (FIG. 4) of the base 34 of the electrical component assembly 16 is not received within the slots 56 (FIG. 7) of the corresponding alignment pin 30.

Figure 11:
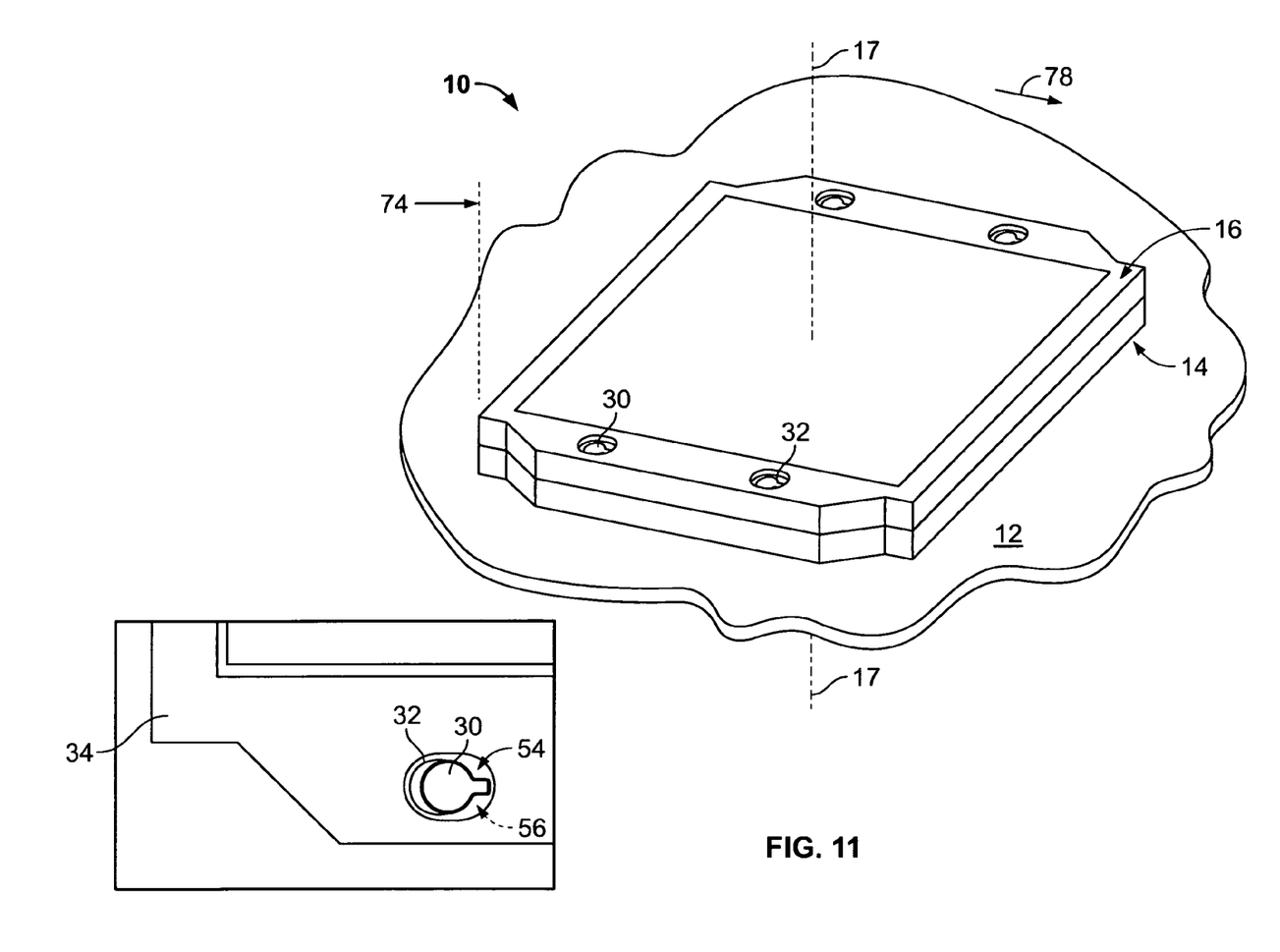
FIG. 11 is a perspective view of the electrical connector assembly shown in FIG. 1 in a position wherein electrical contacts of the assembly are engaged.

Referring now to FIG. 11, the electrical component assembly 16 can be moved from the position 72 (FIG. 10) to a position 74, shown in FIG. 11, wherein the electrical component assembly 16 and the electrical connector 14 are operationally connected. The electrical component assembly 16 is moved from the position 72 to the position 74 by moving the electrical component assembly 16 such that each edge portion 54 of the base 34 of the electrical component assembly 16 is received within the slots 56 of the corresponding alignment pin 30. In the position 74, each electrical contact 26 of the electrical component assembly 16 is engaged with and electrically connected to the corresponding electrical contact 20 of the electrical connector 14, such that the assembly 16 and the connector 14 are operationally connected. Specifically, when moved from the position 72 into the position 74, the electrical contacts 26 move from the corresponding gap 76 (FIG. 6) and into engagement with the corresponding electrical contacts 20. Cooperation between the keying components 62 of the alignment pins 30 and the keying components 60 of the alignment openings 32 facilitates preserving alignment between the electrical component assembly 16 and the electrical connector 14 during movement from the position 72 to the position 74. To disconnect the electrical component assembly 16 from the electrical connector 14, the assembly 16 is moved from the position 74 to the first position 72, and is thereafter moved away from the connector 14 along the connection axis 17 such that the electrical contacts 26 are withdrawn from the gaps 76 and the alignment pins 30 are withdrawn from the alignment openings 32.

Each slot 56 is positioned at the location (the predetermined height H (FIG. 7) along the length L (FIG. 7) of the corresponding alignment pin 30 such that the edge portions 54 are only receivable in the corresponding slots 56, and therefore the electrical component assembly 16 is only movable to second position 74, when the electrical component assembly 16 is at the predetermined position along the connection axis 17 relative to the electrical connector 14. Specifically, the electrical contacts 26 of the electrical component assembly 16 can only be moved to be engaged with and electrically connected to the electrical contacts 20 of the electrical connector 14 from the predetermined position along the connection axis 17 relative to the electrical connector 14.

The predetermined position of the electrical component assembly 16 along the connection axis 17 is selected so that when the electrical contacts 26 are moved to engage with and electrically connect to the electrical contacts 20, the contacts 20, 26 properly engage to establish a reliable electrical connection without damaging the contacts 20, 26 and/or other portions of the electrical connector 14 and/or the electrical component assembly 16. Specifically, when the electrical component assembly 16 is at the selected predetermined position along the connection axis 17 but the electrical contacts 20, 26 are not engaged (i.e., the position 72), the electrical contacts 26 are aligned with the electrical contacts 20 such that when the electrical contacts 26 are moved to engage the electrical contacts 20 (i.e., to the position 74), the electrical contacts 20, 26 and/or other portions of the component assembly 16 and/or the electrical connector 14 will not engage in a manner that would cause damage to the contacts 20, 26 and/or the other portions of the electrical connector 14 and/or the component assembly 16. In the exemplary embodiment, the engagement surface 48 of the electrical component assembly 16 is engaged with the engagement surface 66 of the electrical connector 14 when the electrical component assembly 16 is in the predetermined position along the connection axis 17 relative to the electrical connector 14, i.e., the surfaces 48, 66 are engaged in both the positions 72, 74. However, the predetermined position along the connection axis 17 may be any suitable relative position between the electrical component assembly 16 and the electrical connector 14 that enables the electrical connector assembly 10 to function as described herein, whether or not the surfaces 48, 66 are engaged.

In the exemplary embodiment, the electrical component assembly 16 is moved between the positions 72, 74 by moving the assembly 16 in a direction 77, 78, respectively (FIGS. 10 and 11, respectively), that is generally perpendicular to the connection axis 17. However, the electrical component assembly 16 may be moved between the positions 72, 74 in any suitable direction(s) relative to the connection axis 17 that enable the electrical connector assembly 10 to function as described herein. The electrical component assembly 16 may be moved between the positions 72, 74 and/or held in the positions 72, 74, using any suitable configuration, arrangement, structure, and/or means (not shown), such as, but not limited to, biasing mechanisms, levers, frictional engagement, and/or the muscles of a person.

Figure 12:
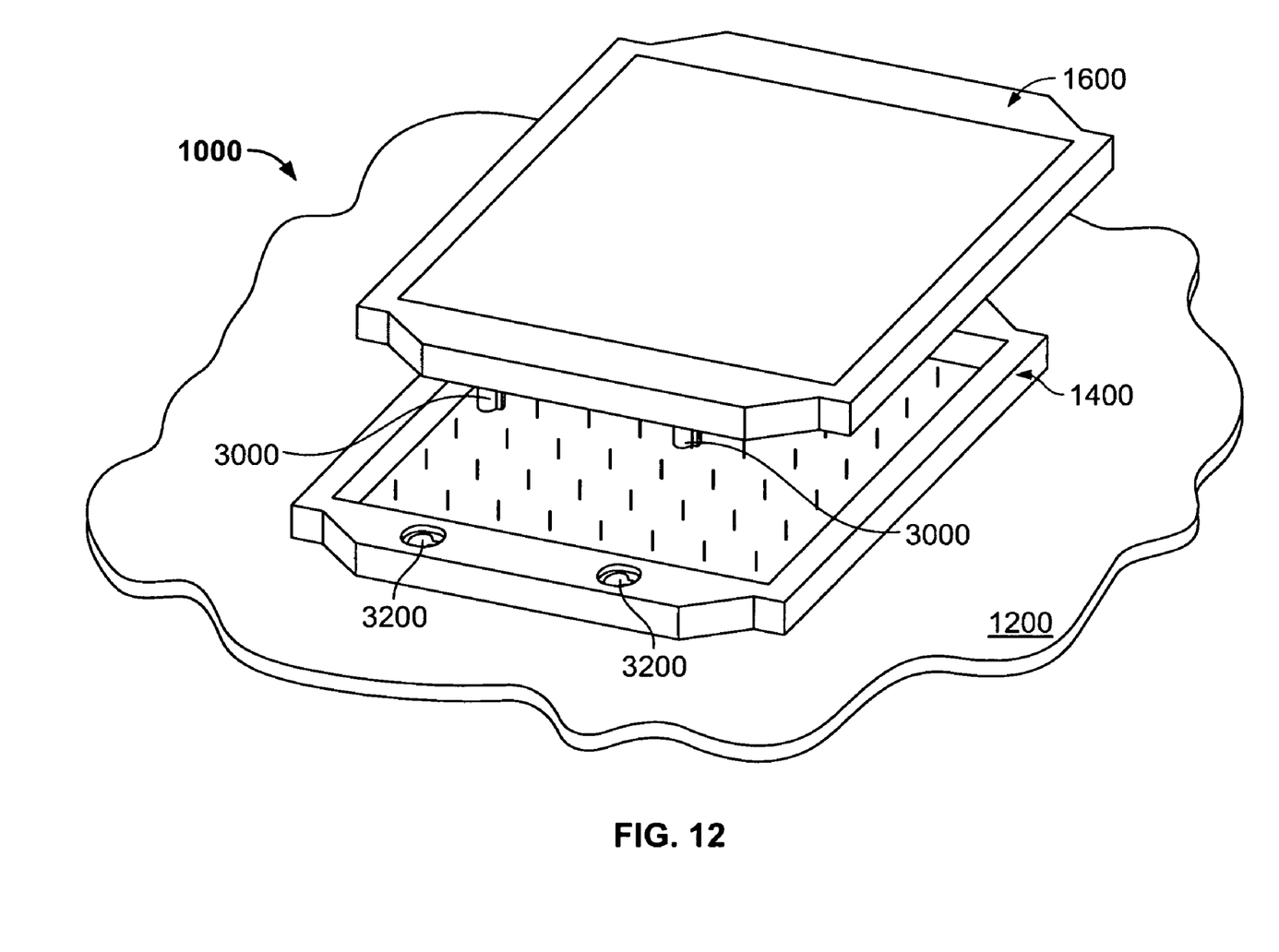
FIG. 12 is a partially exploded perspective view of an electrical connector assembly formed in accordance with an alternative embodiment of the present invention.

FIG. 12 is a partially exploded perspective view of an electrical connector assembly 1000 formed in accordance with an alternative embodiment of the present invention. The electrical connector assembly 1000 includes a substrate 1200, an electrical connector 1400 mounted on the substrate 1200, and an electrical component assembly 1600. The electrical connector assembly 1000 is similar to the electrical connector assembly 10 (FIG. 1). However, in the embodiment shown in FIG. 12, the electrical connector 1400 includes a plurality of alignment openings 3200 while the electrical component assembly 1600 includes a plurality of alignment pins 3000 that are each received within a corresponding alignment opening 3200. The alignment pins 3000 and the alignment openings 3200 are substantially similar to the alignment pins and openings described and illustrated herein with respect to FIGS. 1-10, and therefore will not be described in more detail herein.

The embodiments described and illustrated herein provide an electrical connector assembly that prevents electrical contacts of an electrical connector and component from engaging before the electrical connector and component are fully engaged, which may facilitate preventing damage to the electrical contacts and/or other portions of the assembly. The embodiments described and/or illustrated herein also provide an electrical connector that may have a reduced number of components as compared to known ZIF and LIF connectors.

Exemplary embodiments are described and/or illustrated herein in detail. The embodiments are not limited to the specific embodiments described herein, but rather, components and/or steps of each embodiment may be utilized independently and separately from other components and/or steps described herein. Each component, and/or each step of one embodiment, can also be used in combination with other components and/or steps of other embodiments. When introducing elements/components/etc. described and/or illustrated herein, the articles "a", "an", "the", "said", and "at least one" are intended to mean that there are one or more of the element(s)/component(s)/etc. The terms "comprising", "including" and "having" are intended to be inclusive and mean that there may be additional element(s)/component(s)/etc. other than the listed element(s)/component(s)/etc. Moreover, the terms "first," "second," and "third," etc. in the claims are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

While the invention has been described in terms of various specific embodiments, those skilled in the art will recognize that the invention can be practiced with modification within the spirit and scope of the claims.

What is claimed is:

1. An electrical connector for connection to an electrical component assembly along a connection axis, said electrical connector comprising:
   a body holding a first array of electrical contacts, the first array of electrical contacts being configured to electrically connect to a second array of electrical contacts of the electrical component assembly; and
   an alignment pin extending outwardly from the body, the alignment pin being configured to be received within an alignment opening of the electrical component assembly for aligning the electrical component assembly with the body, the alignment pin comprising at least one slot configured to receive an edge portion of the electrical component assembly that at least partially defines the alignment opening thereof, wherein the slot extends along only a portion of a circumference of the alignment pin.

2. The electrical connector according to claim 1, wherein the alignment pin extends outwardly from the body along a length measured between the body and an end of the alignment pin, the slot being positioned at a location along the length of the alignment pin such that when the edge portion of the electrical component assembly is received within the slot the electrical component assembly is at a predetermined position along the connection axis relative to the body.

3. The electrical connector according to claim 1, wherein the alignment pin extends outwardly from the body along a length measured between the body and an end of the alignment pin, the slot being positioned at a location along the length of the alignment pin such that when the edge portion of the electrical component assembly is received within the slot each electrical contact of the second array of electrical contacts of the electrical component assembly is electrically connected to the corresponding electrical contact of the first array of electrical contacts on the body.

4. The electrical connector according to claim 1, wherein the alignment pin extends outwardly from the body along a length measured between the body and an end of the alignment pin, and the body comprises an engagement surface, the slot being positioned at a location along the length of the alignment pin such that the edge portion of the electrical component assembly is only receivable within the slot when the electrical component assembly is engaged with the engagement surface of the body.

5. The electrical connector according to claim 1, wherein the alignment pin comprises a keying component.

6. The electrical connector according to claim 1, wherein the alignment pin extends outwardly from the body along a length measured between the body and an end of the alignment pin, the slot extending across the alignment pin generally transversely relative to the length of the alignment pin.

7. The electrical connector according to claim 1, wherein the lot comprises a surface that engages the edge portion of the electrical component assembly, the surface comprising a non-circular shape.

8. The electrical connector according to claim 1, further comprising the electrical component assembly, wherein the electrical component assembly includes an electrical component and a base, the alignment opening being within the base.

9. The electrical connector according to claim 1, wherein the at least one slot comprises a pair of slots configured to receive the edge portion of the electrical component assembly that at least partially defines the alignment opening thereof.

10. An electrical connector assembly comprising:
    an electrical component sub-assembly comprising a first array of electrical contacts and an alignment opening;

an electrical connector configured for connection to the electrical component sub-assembly along a connection axis, the electrical connector comprising a body holding a second array of electrical contacts that is configured to electrically connect to the first array of electrical contacts, an alignment pin extends outwardly from the body, the alignment pin being configured to be received within the alignment opening of the electrical component sub-assembly for aligning the electrical component assembly with the electrical connector, the alignment pin comprising at least one slot configured to receive an edge portion of the electrical component sub-assembly that at least partially defines the alignment opening of the electrical component sub-assembly, wherein the electrical component sub-assembly is engageable with the electrical connector body in a first position wherein the alignment pin is received within the alignment opening and each electrical contact of the first array of electrical contacts is not electrically connected to the corresponding electrical contact of the second array of contacts.

11. The electrical connector assembly according to claim 10, wherein the electrical component sub-assembly is movable from the first position to a second position wherein the edge portion of the electrical component sub-assembly is received within the slot of the alignment pin and each electrical contact of the first array of electrical contacts is electrically connected with the corresponding electrical contact of the second array of electrical contacts.

12. The electrical connector according to claim 11, wherein the alignment pin extends outwardly from the body along a length measured between the electrical connector body and an end of the alignment pin, the slot being positioned at a location along the length of the alignment pin such that the edge portion of the electrical component sub-assembly is only movable to the second position when the electrical component sub-assembly is at a predetermined position along the connection axis relative to the electrical connector body.

13. The electrical connector assembly according to claim 11, wherein the electrical component sub-assembly is moved from the first position to the second position in a direction generally perpendicular to the connection axis.

14. The electrical connector assembly according to claim 10, wherein the alignment pin extends outwardly from the body along a length measured between the electrical connector body and an end of the alignment pin, the electrical connector and the electrical component sub-assembly comprising first and second engagement surfaces, respectively, the slot being positioned at a location along the length of the alignment pin such that the edge portion of the electrical component sub-assembly is only receivable within the slot when the first and second engagement surfaces are engaged with each other.

15. The electrical connector assembly according to claim 10, wherein the alignment pin and the alignment opening comprise first and second keying components, respectively, the first and second keying components configured to cooperate with each other.

16. The electrical connector assembly according to claim 10, wherein the alignment pin extends outwardly from the body along a length measured between the electrical connector body and an end of the alignment pin, the slot extending across the alignment pin generally transversely relative to the length of the alignment pin.

17. The electrical connector assembly according to claim 10, wherein the electrical component sub-assembly includes a base and an electrical component held by the base, the first array of electrical contacts of the electrical component sub-assembly being held by the electrical component, the electrical contacts of the first array extending through at least one opening within the base.

18. The electrical connector assembly according to claim 10, wherein the electrical component sub-assembly comprises an electrical component, the first array of electrical contacts being held by the electrical component.

19. The electrical connector assembly according to claim 10, wherein the at least one slot comprises a pair of slots configured to receive the edge portion of the electrical component sub-assembly that at least partially defines the alignment opening.

20. An electrical component assembly for connection to an electrical connector along a connection axis, said electrical component assembly comprising:

a body holding a first array of electrical contacts, the first array of electrical contacts being configured to electrically connect to a second array of electrical contacts of the electrical connector; and an alignment pin extending outwardly from the body, the alignment pin being configured to be received within an alignment opening of the electrical connector for aligning the electrical connector with the body, the alignment pin comprising at least one slot configured to receive an edge portion of the electrical connector that at least partially defines the alignment opening thereof, wherein the slot extends along only a portion of a circumference of the alignment pin.

* * * * *